United States Patent
Buynoski et al.

(10) Patent No.: US 6,232,048 B1
(45) Date of Patent: May 15, 2001

(54) METHOD FOR PREPARING NARROW PHOTORESIST LINES

(75) Inventors: Matthew S. Buynoski, Palo Alto; Che-Hoo Ng, Sunnyvale; Bhanwar Singh, Sunnyvale; Shekhan Pramanick, Sunnyvale, all of CA (US); Subhash Gupta, Singapore (SG)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/260,790

(22) Filed: Mar. 1, 1999

Related U.S. Application Data

(63) Continuation-in-part of application No. 08/774,581, filed on Dec. 31, 1996, now Pat. No. 5,876,903.

(51) Int. Cl.[7] .................. G03C 5/00; G03F 7/26
(52) U.S. Cl. ................ 430/328; 430/313; 427/526
(58) Field of Search .................. 410/313, 314, 410/323, 328; 427/523, 526; 438/766

(56) References Cited

U.S. PATENT DOCUMENTS

| | | |
|---|---|---|
| 3,997,367 | 12/1976 | Yau ........................ 148/1.5 |
| 4,068,018 | 1/1978 | Hashimoto et al. ............ 427/38 |
| 4,599,790 | 7/1986 | Kim et al. .................. 29/571 |
| 4,670,090 | 6/1987 | Sheng et al. ............... 156/653 |
| 4,731,339 | 3/1988 | Ryan et al. ................. 437/29 |
| 5,332,653 | * 7/1994 | Cullen et al. ............... 430/323 |
| 5,538,833 | 7/1996 | Ferguson et al. ............. 430/325 |
| 5,688,719 | 11/1997 | Tsai et al. .................. 437/194 |
| 5,876,903 | * 3/1999 | Ng et al. .................... 430/313 |

* cited by examiner

Primary Examiner—Shean C. Wu
(74) Attorney, Agent, or Firm—David H. Jaffer; Pillsbury Winthrop LLP

(57) ABSTRACT

A method of preparing a narrow photoresist line by first forming a resist pattern on a substrate, wherein a resist line is designed to have a width "w" in excess of a desired width "$w^1$" The resist is then subjected to ionic bombardment with ionized particles in a direction normal to the planar surface of a resistant substrate. The ionic bombardment causes formation of a hardened "chemically less reactive" skin on the exposed top surface of the photoresist. The resist is then subjected to an isotropic etch procedure. Due to the hardened top surface of the narrow pattern, the side wall erode at a faster rate than the top, causing a narrowing of the line width, while retaining a more substantial photoresist thickness than would occur if the top surface would not be hardened in advance of the etch procedure.

8 Claims, 2 Drawing Sheets

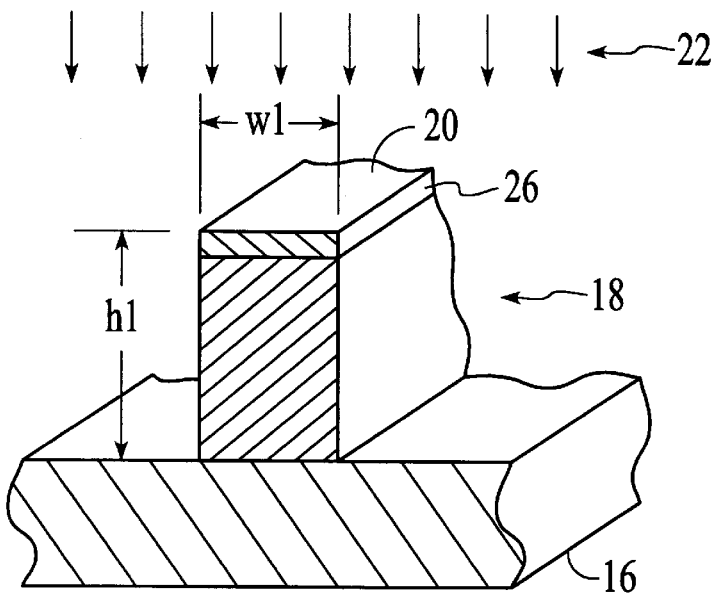
FIG. 2A
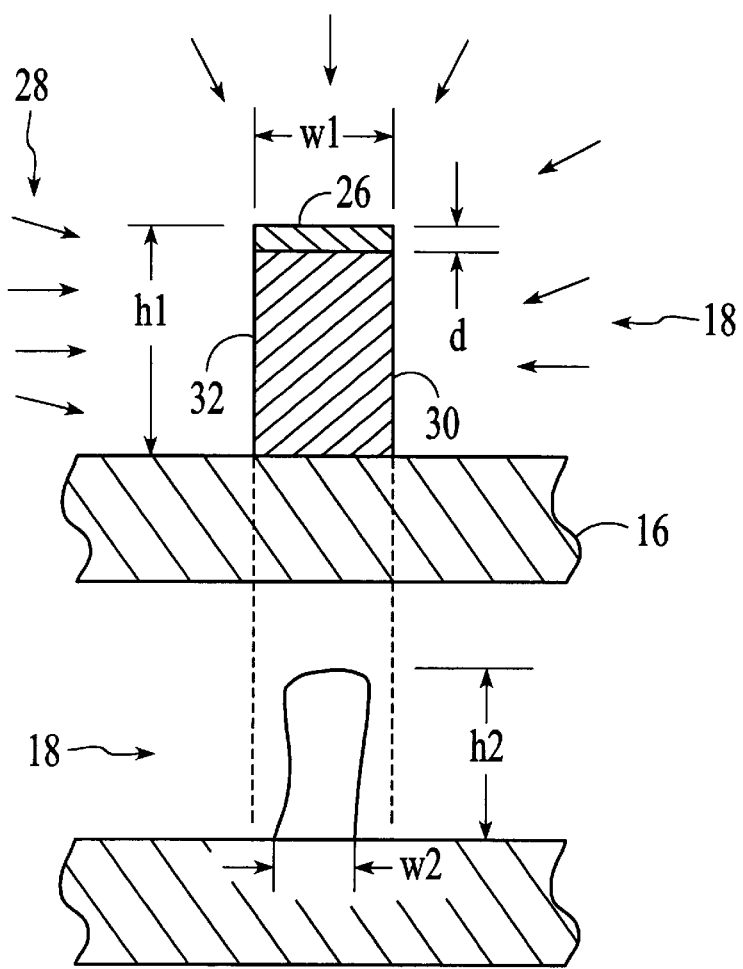
FIG. 2B
FIG. 2C

METHOD FOR PREPARING NARROW PHOTORESIST LINES

Further details of the back ground art and photoresists and etching and etchants are described in U.S. patent Ser. No. 08/774,581 filed Dec. 31, 1996 now U.S. Pat. No. 5,876,903 and incorporated herein by reference.

BACKGROUND OF THE INVENTION

1. Technical Field

The present invention relates generally to photoresists used as a mask for etching purposes, and more particularly to a method of preparing reduced photoresist critical dimensions by forming a hardened top photoresist layer and performing an isotropic etch procedure.

2. Background Art

The process of accurately etching patterns has been the subject of significant development, particularly in the field of semiconductor electronics. The degree of circuit miniaturization, affecting a product's size and operational frequency limits for example, depend on the degree of accuracy of etching. The process of etching a pattern involves the use of a mask to selectively allow an etchant to remove the semiconductor or conductive material, as required to form the desired pattern. Typically, a mask is formed by spin coating a layer of liquid photoresist on the material to be etched. The desired pattern on the photoresist is then exposed to a form of radiation, for example, through use of an optical mask and ultraviolet light. The exposed areas of the photoresist are rendered either soluble or insoluble to a developer, depending on whether the resist is a positive or negative type. The soluble portions are then removed, and the remaining photoresist functions as a mask for selectively allowing an etchant to remove underlying material in areas void of photoresist protection.

A particular problem arises when the creation of resist line widths of small dimensions is required. The minimum resist line width that can be formed in a direct application of photoresist and subsequent etch is often not small enough. For example, the formation of transistor gates of length (actually a line width) less than 0.15 microns is very difficult, requiring expensive UV and/or phase shift methods. A simpler technique that is used is called "gate trimming", wherein after the lithography (photoresist pattern) is formed on the substrate, the resist is etched down so as to narrow the line widths. This technique has severe limitations, as will be explained in reference to FIGS. 1A and 1B.

FIG. 1A shows a cross section of a photoresist line 10 of width "w" and height "h". In order to further reduce the width "w" prior to performing an operation on a substrate 12, a selective isotropic etch procedure is performed on the resist 10. The result is shown in FIG. 1B. The width "w" has been reduced to "$w^1$" at the cost of losing much of the protective height "h" that is reduced to "$h^1$". Since there are limits to the ratio of "h" to "w" in FIG. 1A that can be realized, there is a corresponding limit to the width "$w^1$" that can be achieved by etching, before the height "$h^1$" is too small to provide adequate protection to the underlying area 14 from subsequent processing steps.

From the above discussion, it is apparent that there is a need for an improved method of preparing narrow photoresist line widths.

DISCLOSURE OF THE INVENTION

Briefly, a preferred embodiment of the present invention includes a method of preparing a narrow photoresist line by first forming a resist pattern on a substrate, having a resist line designed to a width "w" in excess of a desired width "$w^1$". The resist is then bombarded with ionized particles in a direction normal to the planar surface of the resist and substrate. The ionic bombardment causes formation of a hardened, "chemically less reactive" skin on the exposed top surface of the photoresist. The resist is then subjected to an isotropic etch procedure. Due to the hardened top surface of the resist, the side walls erode at a faster rate than the top, causing a narrowing of line widths, while retaining a more substantial photoresist thickness than would occur if the top surface had not been hardened in advance of the etch procedure.

An advantage of the present invention is that it provides a method of constructing narrow width lines of greater thickness.

A further advantage of the present invention is that it provides a method of constructing narrow resist lines without the need for a corresponding narrow resist mask line width.

A still further advantage of the present invention is that it provides a lower cost method of preparing high profile, narrow resist lines.

BRIEF DESCRIPTION OF THE DRAWINGS

FIG. 2A illustrates a photoresist line with a hardened top surface according to the present invention;

FIG. 2B illustrates the application of an isotropic etch to reduce the line width; and FIG. 2C shows a line profile subsequent to the isotropic etch procedure.

MODE(S) FOR CARRYING OUT THE INVENTION

Figure 1A:
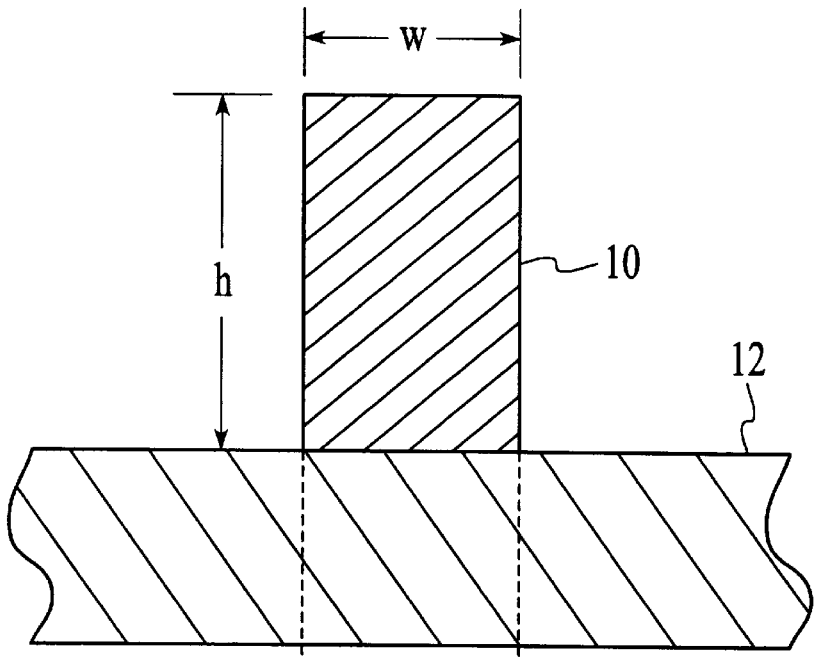
FIG. 1A shows a cross section of a prior art resist line on a substrate.
Figure 1B:
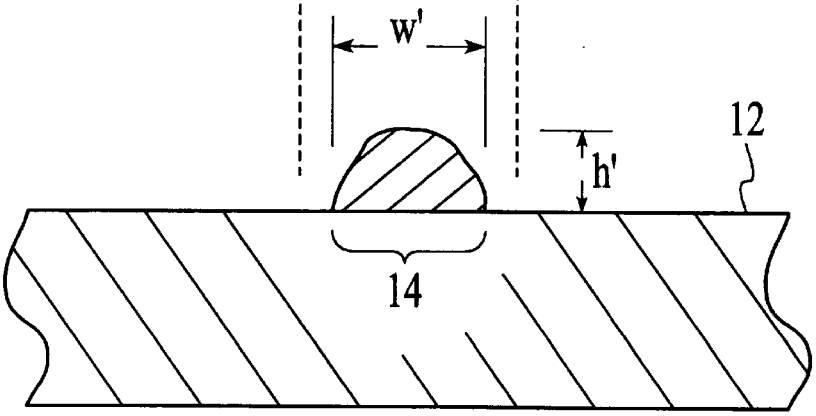
FIG. 1B shows the result of an isotropic etch on the line of FIG. 1A.

In reference now to FIGS. 2A and 2B, the method of the present invention is illustrated. FIG. 2A shows a cross section of a substrate 16 upon which a narrow photoresist line is formed having a width "$w_1$" and a height "$h_1$". According to the method of the present invention, the top surface 20 of the resist is first subjected to an ionic bombardment 22 in a direction orthogonal to the surface 20. The ionic bombardment creates a surface layer 26 that is less chemically reactive than normal photoresist, and erodes at a reduced rate when subjected to an etchant.

Referring now to FIG. 2B, the line 18 is subjected to an isotropic etchant, indicated by arrows 28 that attack all exposed surfaces of the line 18. The hardened surface 26 erodes more slowly than the unhardened side walls 30, 32. The result of the etch process is illustrated in FIG. 2C, showing the width of the line 18 reduced to $w_2$. The processed line 18 has a larger height to width ratio $h_2/w_2$ than it would have if the surface layer 26 had not slowed the vertical etch rate. The result is a line 18 with a narrow line width $w_2$ and a significantly increased height $h_2$, providing increased protection during subsequent operations to be performed on the substrate 16.

The process of creating a hardened layer such as 26 is more fully discussed in U.S. patent Ser. No. 08/774,581 which is incorporated in this disclosure by reference. U.S. Ser. No. 08/774,581 discloses use of a hardened layer on both the top and side walls of a resist line to achieve substrate etching accuracy. The present application, as discussed above, includes a method of using hardened resist only on the top surface of a resist, and then subjecting the resist to an isotropic etch procedure to create a more narrow resist line width, prior to the substrate etching procedure described in Ser. No. 08/774,581.

For the process of the present application, an ionic bombardment dose in the range of $10^{15}$ ions/cm$^2$ to $10^{16}$ ions/cm$^2$ is preferred. Atoms are selected from a group of heavy ions not having deleterious side effects. Typical atoms include $N_2$, Ar, Xe, Si, Ge, and Kr. The particular atom selected may depend on the substrate. For example, the use of nitrogen and silicon may form silicon nitride, and impede a subsequent etch procedure. Such a selection would not be preferred. A selection of an inert gas that will not react with the photoresist is preferred. The group consisting of noble gases and nitrogen is a further preferred group, with a still further preference being the group including argon and nitrogen. Argon, which is chemically inert and readily available in most implanters, is the preferred selection from among the group of inert gases due to its convenience and compatibility with current implant processing.

The implant ion energy is adjusted according to the mass of the ion chosen so as to harden the photoresist to a useful depth, beginning at the photoresist surface. For this reason, the energy level is kept relatively low. The particular energy level depends on the ion chosen. Typically, an energy less than 40 kev is selected. An energy range of 20 kev to 100 kev is most useful. A typical depth d (FIG. 2B) of hardening is in the range of 0.05 µm to 0.3 µm. Following the hardening of the top surface, the line 18 is subjected to an isotropic etch.

A typical narrow line width $w_1$ (FIG. 2A) before etching is in the range of 0.18 µm, and a height $h_1$ of 1.0 µm. After etching (FIG. 2C) the width $w_2$ would typically be about 0.10 µm with a height $h_2$ of 0.4 to 0.8 µm., Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of reducing the width of a photo resist line comprising the steps of:
   (a) hardening a top surface of said line by bombarding the top surface with ions, and said line having a height, and a width defined by a distance between first and second sidewalls; and
   (b) etching said line with an isotropic etching procedure to reduce said width of said line.

2. A method as recited in claim 1 wherein said ions are a selected species that will not chemically react with said photoresist.

3. A method as recited in claim 1 wherein said ions are created from gases selected from the group consisting of inert gases.

4. A method as recited in claim 3 wherein said ions are created from gases selected from the group consisting of noble gases and nitrogen.

5. A method as recited in claim 4 wherein said ions are created from gases selected from the group consisting of argon and nitrogen.

6. A method as recited in claim 1 wherein said ions have an energy in the range of 20 to 100 kev.

7. A method as recited in claim 6 wherein said ions have an energy less than 40 kev.

8. A method as recited in claim 1 wherein said ions are applied having a dose in the range of $10^{15}$ to $10^{16}$ ions per cm$^2$.

* * * * *